(12) United States Patent
Chen et al.

(10) Patent No.: US 6,512,687 B1
(45) Date of Patent: Jan. 28, 2003

(54) NON-VOLATILE FERROELECTRIC CAPACITOR MEMORY CIRCUIT

(75) Inventors: Shue-Shuen Chen, Yunlin Hsien (TW); Hsiang-Lan Lung, Hsinchu (TW)

(73) Assignee: Macronix International Co., Ltd., Taiwan (CN)

(*) Notice: Subject to any disclaimer, the term of this patent is extended or adjusted under 35 U.S.C. 154(b) by 0 days.

(21) Appl. No.: 10/036,358

(22) Filed: Jan. 7, 2002

(51) Int. Cl.[7] ............................................. G11C 11/22
(52) U.S. Cl. .................... 365/145; 365/154; 365/149
(58) Field of Search .................... 365/145, 149, 365/154

(56) References Cited

U.S. PATENT DOCUMENTS 5,751,627 A  * 5/1998 Ooishi ......................... 365/145
6,141,237 A  * 10/2000 Eliason et al. ............... 365/145

* cited by examiner

Primary Examiner—Tan Nguyen (57) ABSTRACT

A non-volatile memory circuit having ferroelectric capacitors. Two ferroelectric capacitors are combined with a volatile memory cell. The volatile memory cell has two internal nodes. The two internal nodes are respectively connected to the two ferroelectric capacitors. The ferroelectric capacitors are set to opposite polarization states as a function of the voltage states of the two internal nodes. When power is lost from the memory circuit, the last data state of the two internal nodes is stored into the ferroelectric capacitors. When power is applied to the memory circuit again, one of the two ferroelectric capacitors will change its polarization state, which results in a voltage difference in the two internal nodes, so that the last data state can be restored to the volatile memory portion.

19 Claims, 6 Drawing Sheets

NON-VOLATILE FERROELECTRIC CAPACITOR MEMORY CIRCUIT

FIELD OF THE INVENTION

The present invention relates to a memory circuit, and more particularly is related to a non-volatile memory circuit.

BACKGROUND OF THE INVENTION

Integrated circuit memories have come into extensive use in many applications, particularly for computer systems. It has been a pronounced technological trend to increase the capacity and density of such memories. As manufacturing and design techniques have improved, the cost of memory circuits has decreased dramatically, and this has greatly expanded the number of applications and the size of the market. There are essentially two types of data memory devices used in computers today, "Nonvolatile" and "Volatile". Common nonvolatile memory devices include well known Read Only Memory (ROM) devices that include EPROM (erasable programmable ROM) devices, EEPROM (electrically erasable programmable ROM) devices, and Flash EEPROM devices. These nonvolatile memory devices maintain the data stored therein, even when power to the device is removed, and thus they are nonvolatile. Volatile memory devices include Dynamic Random Access Memory (DRAM) and Static Random Access Memory (SRAM) devices. This distinction generally follows from the type of memory cell incorporated in the RAM. In the case of a dynamic RAM memory cell, data is stored in a capacitor. Because the charge is stored in a capacitor in the substrate, the charge dissipates and needs to be refreshed periodically in order to preserve the content of the memory. Static RAMS differ from dynamic RAMS by having memory cells which do not need to be refreshed. A static RAM cell usually includes several MOS transistors configured as a flip-flop which has two stable states. These two states are used for storing the two different levels of binary data. Static RAM cells, because they include several transistors, are larger than DRAM cells and therefore cannot be packed as densely on semiconductor chips. On the other hand, static RAMS operate quickly and do not require the logic circuitry needed for refresh operations.

Figure 1:
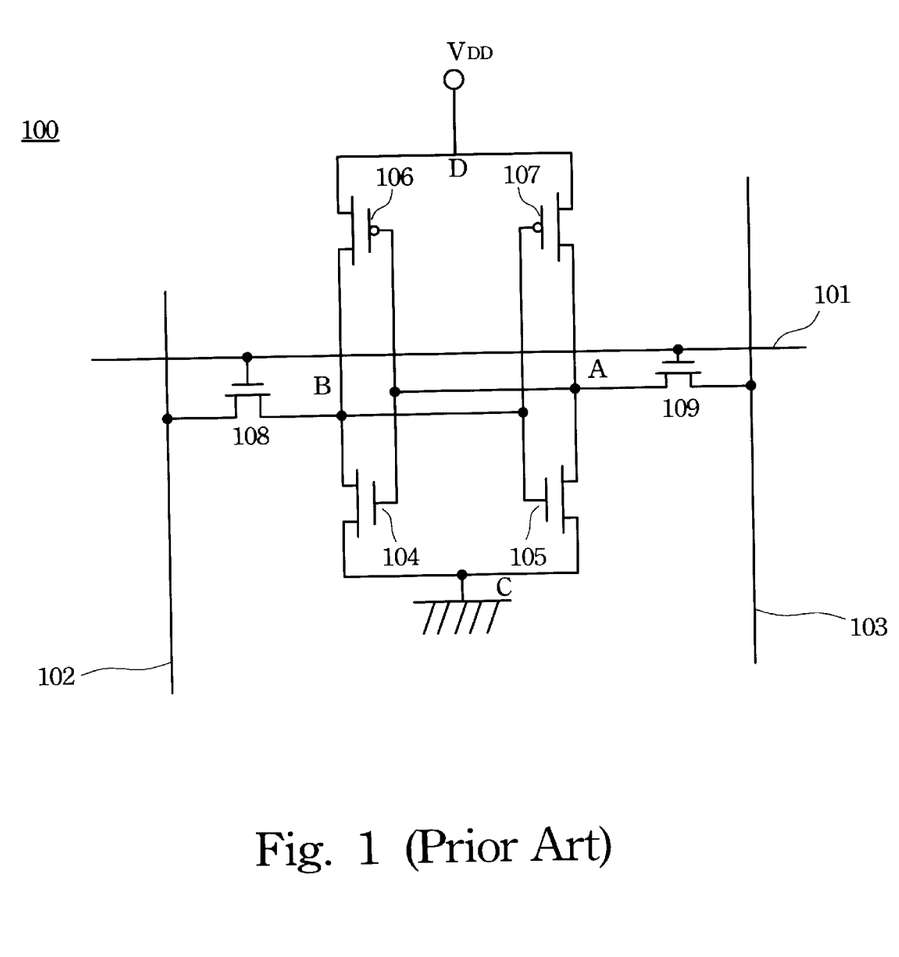
FIG. 1 is a schematic diagram of a conventional static RAMS circuit.

FIG. 1 illustrates a circuit diagram of a conventional static RAM 100. The static AM 100 includes two n-channel MOS transistors 104, 105 and two p-channel MOS transistors 106, 107. A pair of nodes A and B is cross coupled to the gate electrodes of MOS transistors 104 to 107 (flip-flop structure). This cross-coupled arrangement produces a regenerative effect which drive the nodes A and B to opposite voltage states. When one node is high the other is low. The circuit 100 therefore has two data states. A node C is set at the $V_{ss}$ level of zero volts. A further node D couples to a full $V_{dd}$ source. The source-drain paths of access MOS transistors 108 and 109 couple internal nodes A and B, respectively, to bit lines 102 and 103. The gate electrodes of access MOS transistors 108 and 109 are coupled to word line 101.

Figure 2:
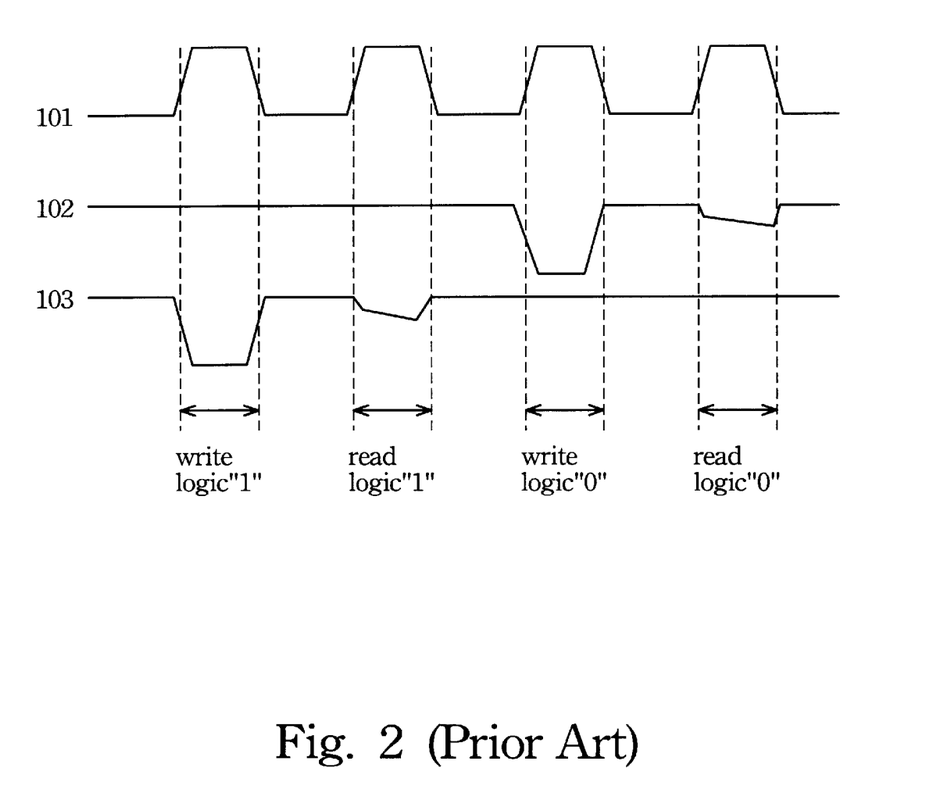
FIG. 2 illustrates a reading and writing waveform diagram of a static RAM.

FIG. 2 illustrates a reading and writing waveform diagram of a static RAM 100. When writing logic "1" into the static RAM 100, the voltage state of word line 101 and bit line 102 are maintained at a high level. The high state at node B causes MOS transistor 107 to be turned off and MOS transistor 105 to be turned on. This pulls node A to a low voltage state; bit line 103 is also in a low voltage state. The low state at node A permits MOS transistor 106 to be on while holding MOS transistor 104 turned off. This further causes node B to be pulled to a high voltage state through MOS transistor 106. A logic "1" state for the static RAM 100 is arbitrarily defined to be node B high and node A low. When reading logic "1" from the static RAM 100, bit lines 103 and 102 are first set in predetermine voltage state. Then, a high voltage is applied to the word line 101. At this time, the predetermined voltage state of bit line 103 is pulled down from MOS transistors 105 and 109. A data reading circuit (not shown in FIG. 2) detects a voltage difference between the bit line 102 and 103 and enlarges the difference to read out the stored data, logic "1".

When writing logic "0" into the static RAM 100, the voltage state of word line 101 and bit line 103 are maintained at a high level. The high state at node A causes MOS transistor 106 to be turned off and MOS transistor 104 to be turned on. This pulls node B to a low voltage state and bit line 102 is also in low voltage state. The low state at node B permits MOS transistor 107 to be on while holding MOS transistor 105 is turned off. This further causes node A to be pulled to a high voltage state through MOS transistor 107. A logic "0" state for the static RAM 100 is arbitrarily defined to be node A high and node B low. When reading logic "0" from the static RAM 100, bit lines 103 and 102 are first set to a predetermined voltage state. Then, a high voltage is applied to the word line 101. At this time, the predetermined voltage state of bit line 102 is pulled down from MOS transistors 104 and 108. A data reading circuit (not shown in FIG. 2) detects a voltage difference between bit lines 102 and 103 and enlarges the difference to read out the stored data, logic "0".

However, the low cost, large capacity static RAM circuits now in use have volatile memory storage, that is, the data stored in these memories is lost when the power is removed. There are many applications that could be enhanced if low cost, non-volatile memories could be made. In certain applications, it is essential that the data be retained in the memory when power is removed. To fill this market, several types of non-volatile memories have been developed. Among the most common of these now in use is the electronically programmable read only memory (EPROM). However, the non-volatile memories now available typically have a rather low density of memory storage, are generally complex to manufacture, often have a limited lifetime and are much more expensive than volatile memories. Therefore, from the foregoing, it can be seen that a need exists for non-volatile memory storage having low cost and high density of memory storage.

SUMMARY OF THE INVENTION

The conventional static RAMS, while having the advantage of being randomly accessible, have the disadvantage of being volatile. That is, when power is removed from the memories, the data dissipates. The voltage used to preserve the flip-flop states in the static RAM memory cells drops to zero so that the flip-flop loses its data. Therefore, the static RAMS according to the present invention uses ferroelectric capacitors for memory cells that have a significant advantage of being non-volatile. Briefly, a ferroelectric capacitor includes a pair of capacitor plates with a ferroelectric material between them. A ferroelectric material has two different stable polarization states and can store the polarization state even though the applied voltage is removed. By assigning a binary zero to one polarization state and a binary one to the other polarization state, ferroelectric capacitors can be used to store binary information. Therefore, according to the present invention, the data of the static RAMS is restored into the ferroelectric capacitors. The advantage of this arrangement is that even though power may be interrupted or removed from the memory, data continues to be stored.

According to the present invention providing a new memory circuit design, a conventional static RAMS is combined with a ferroelectric capacitors circuit, which takes these advantages of non-volatile characteristics and providing fast, random writing and reading of data for such circuits. The memory circuit according to the present invention comprises two MOS transistor circuits to form a CMOS flip-flop circuit and two ferroelectric capacitors According to the preferred embodiment, the MOS transistor circuit is composed of both a P type MOS transistor and an N type transistor. The two circuits have respectively a common node, and the two common nodes are cross-coupled for producing differential voltage states at the two nodes, respectively. Each MOS transistor circuit couples with a ferroelectric capacitor. The two ferroelectric capacitors are connected together by a MOS transistor and connected to a plate line through another transistor. The two ferroelectric capacitors are used to store data when power may be removed from the memory circuit.

During a writing operation, a voltage is applied to the plate line to result in the voltage difference between the plate line and the two common nodes. Thus, the two ferroelectric capacitors are set to have differential polarization states to store data. During a reading operation, approximately one half of Vcc is applied to the two common nodes. Then, a Vcc voltage is applied to the plate line that causes a charge transfer across the two ferroelectric capacitors into the nodes respectively. At the time of the voltage Vcc at plate line, a transition in the polarization state of one of the two ferroelectric capacitors is caused because the voltage at the plate line is opposite to the polarization state of the capacitor, therefore, there is a net charge shift in current. This situation causes the unbalanced condition of the two common nodes, thereby reestablishing the previous data state in the memory circuit.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Without limiting the spirit and scope of the present invention, the method proposed in the present invention is illustrated with one preferred embodiment about non-volatile memory circuits. Skill artisans, upon acknowledging the embodiments, can apply the present invention to any kind of the static, dynamic, or other type, to combine with a ferroelectric capacitor or circuit. When power is removed, the ferroelectric capacitor is written into so that the data stored in the memory cell is preserved in the ferroelectric capacitor despite the loss of power. Therefore, the memory circuit in accordance with the present invention has the advantages of ROM and RAM. This memory circuit may randomly access data and preserve data after power loss. The circuit may keep the static RAM characteristics for providing fast, reliable writing and reading of data. On the other hand, the ferroelectric capacitors do not occupy much area, and therefore do not affect the whole area.

Figure 3:
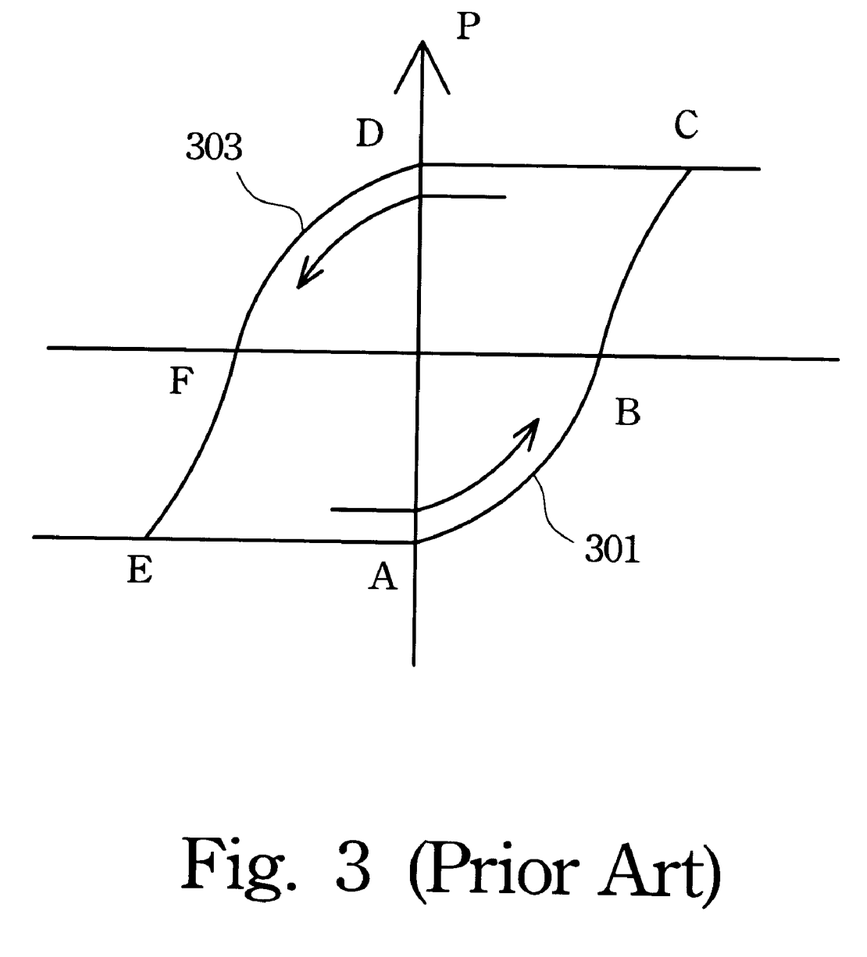
FIG. 3 is a hysteresis curve illustrating the polarization characteristics of a ferroelectric capacitor.

FIG. 3 illustrates a hysteresis curve of a ferroelectrical material. The abscissa represents the field voltage applied to the material and the ordinate represents the polarization of the material. If a capacitor is formed using a ferroelectric material between its plates, because of the hysteresis curve, the flow of current through the capacitor depends on the prior history of the voltages applied to the device. If a ferroelectric capacitor is in an initial state to which zero volts are applied, point A or point D may indicate polarization. Assuming that point A in FIG. 1 indicates polarization, a positive voltage which is greater than the coercive voltage (referring to point B in FIG. 1) is applied across the capacitor, then the capacitor conducts current and has a new polarization (referring to point C in FIG. 1) state. When the applied voltage is removed, the ferroelectric capacitor maintains the same polarization state as shown at point D instead of returning to the state as shown at point A. A positive voltage continuously applying across the capacitor will cause a little change on the polarization. However, a sufficient negative voltage will cause the polarization to vary from point D to point E as indicated in FIG. 1. Once the negative voltage is removed from the capacitor, the ferroelectric capacitor maintains the same polarization state and the curve moves to point A. Therefore, point A and point D respectively represent two different logical states when zero volts are applied across the capacitor. Therefore, from the foregoing description, the polarization states remain after the electric field is removed. The present invention uses this kind of characteristic of the ferroelectric capacitor to store data.

Figure 4:
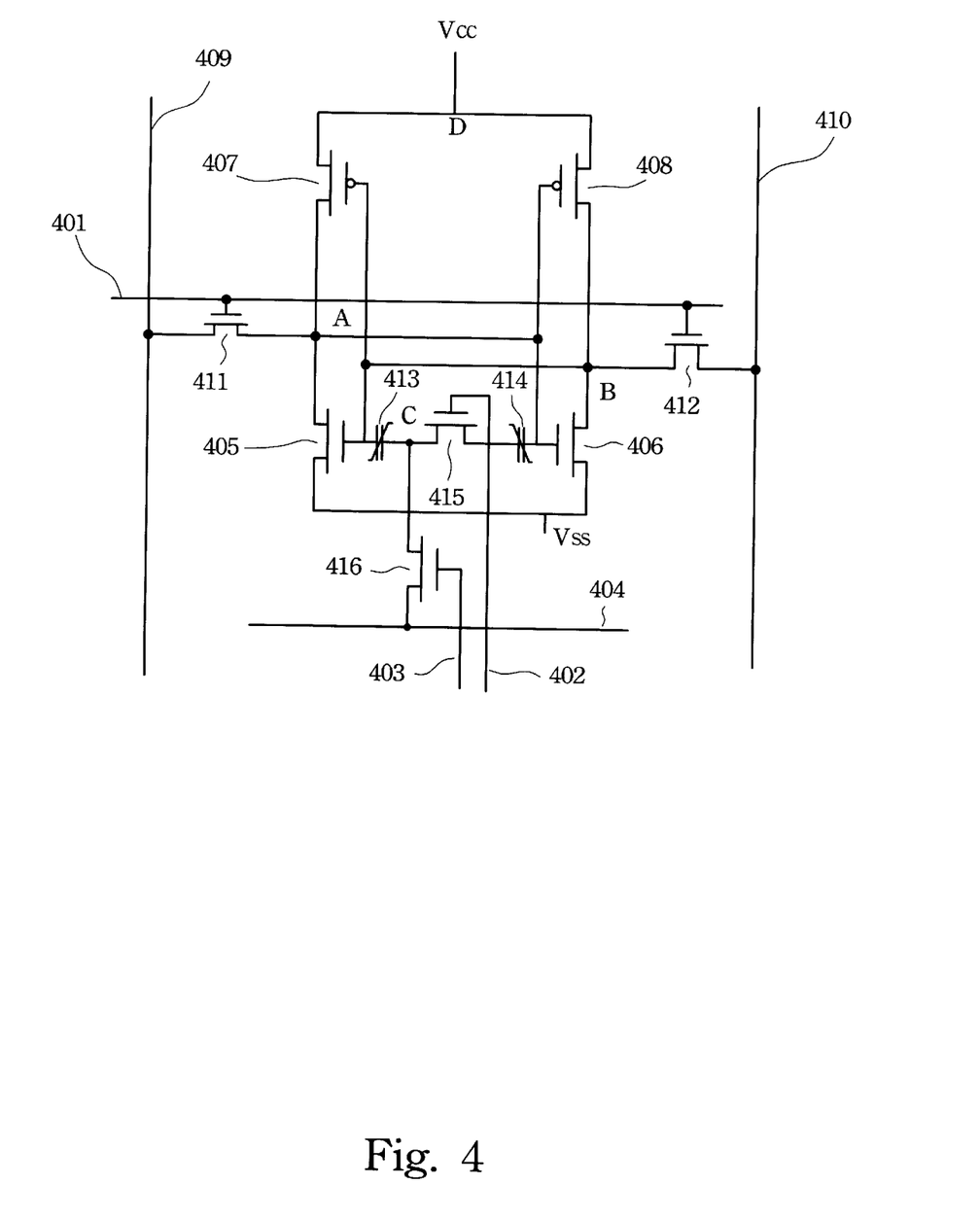
FIG. 4 is a schematic diagram of a non-volatile memory circuit in accordance with the present invention.

FIG. 4 is a schematic diagram of a non-volatile memory circuit 400 in accordance with the present invention. The non-volatile memory circuit 400 in accordance with the present invention combines two ferroelectric capacitors with a volatile memory cell, wherein the volatile memory cell is a CMOS static RAM cell. However, it must be understood that such a memory cell is illustrative only and that other types of memory cell can be used. The CMOS static RAM cell includes two n-channel MOS transistors 405, 406 and two p-channel MOS transistors 407, 408. The gate terminals of MOS transistors 405 and 407 are connected to node B and the gate terminals of MOS transistors 406 and 408 are connected to node A. The pair of nodes A and B are cross coupled to the gate electrodes of MOS transistors 405 to 408 (flip-flop structure). This cross-coupled arrangement produces a regenerative effect which drive the nodes A and B to opposite voltage states. When one node is high the other is low. The circuit 400 therefore may store two data states, logic "0" or logic "1".

On the other hand, the first ferroelectric capacitor 413 is connected to the gate terminal of MOS transistor 405. The second ferroelectric capacitor 414 is connected to the gate terminal of MOS transistor 406. The two ferroelectric capacitors both are connected to a MOS transistor 415 and are connected through a MOS transistor 416 to a plate line 404. The MOS transistor 415 is provided to separate the two ferroelectric capacitors for preventing time dependent dielectric breakdown when processing dielectric layer and leakage current. The polarization states of the two ferroelectric capacitors may be set by activating the common nodes A, B and plate line 403. The common node A is connected through a MOS transistor 411 to a bit line 409. The common node B is connected through a MOS transistor 412 to a bit line 410. The gate terminals of MOS transistor 411 and 412 are connected to a word line 401. A signal is input to the word line to control whether the MOS transistors 411 and 412 are "ON" or "OFF".

Figure 5:
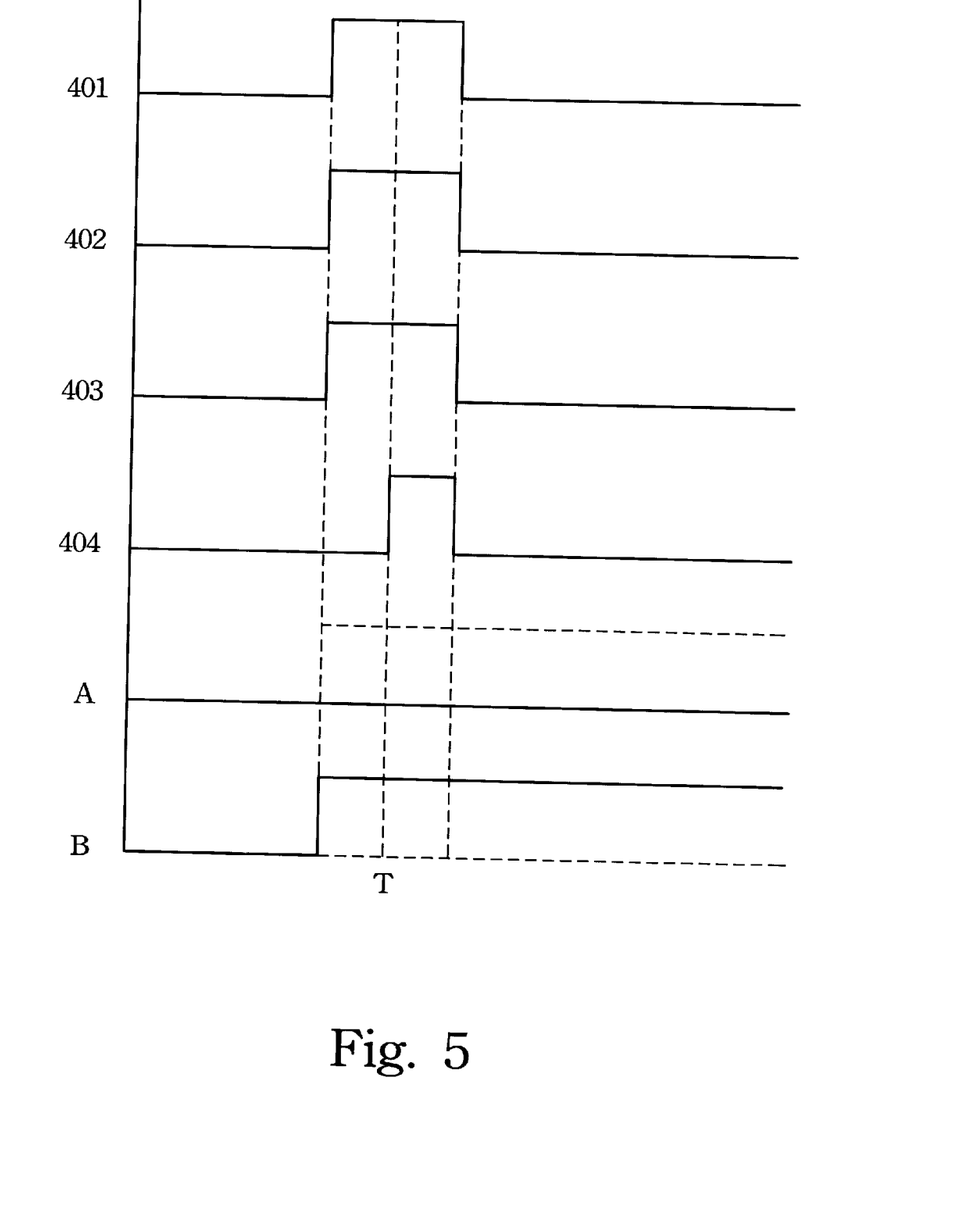
FIG. 5 illustrates a writing wave form diagram of a non-volatile memory circuit in accordance with the present invention.

FIG. 5 illustrates a writing waveform diagram of a non-volatile memory circuit in accordance with the present invention. The two states of the memory circuit 400 correspond to the data states 1 and 0. The data state of the circuit 400 can be set by inputting a high voltage to the word line 401 to turn on the MOS transistors 411 and 412 to receive the input signal from the bit line. Assuming a high voltage is applied to the bit line 409, the node A is driven to a high state. The high state at node A causes MOS transistor 406 to be turned on and MOS transistor 408 to be turned off. This pulls node B to a low voltage state, Vss. The low state at node B permits MOS transistor 407 to be on while MOS transistor 405 continues to be off. This further causes node A to be pulled to a high voltage state, Vcc, through MOS transistor 407. A logic state for the memory circuit 400 is arbitrarily defined to be node A high and node B low as shown by a dotted line in FIG. 5.

On the other hand, assuming a low voltage is applied to the bit line 409, the node A is driven to a low state. The low state at node A causes MOS transistor 408 to be turned on and MOS transistor 406 to be turned off. This pulls node B to a high voltage state, Vcc. The high state at node B permits MOS transistor 405 to be on while MOS transistor 407 continues to be turned off. This further causes node A to be pulled to a low voltage state, Vss, through MOS transistor 405. A logic state for the memory circuit 400 is arbitrarily defined to be node A low and node B high as a shown line in FIG. 5. Therefore, logic "0" and logic "1" may be defined by this two state.

A logic data "1" state for the memory circuit 400 is arbitrarily defined to be the common node A low and common node B high. The ferroelectric capacitor is written into so that the data stored in the memory circuit will be preserved in the ferroelectric capacitor despite the loss of power. The writing method is the application of a high voltage to the signal lines 402 and 403 to turn on the MOS transistors 415 and 416. In this situation, the ferroelectric capacitors 413 and 414 are connected to the plate line 404. At this time, the plate line 404 is at a low voltage and the common node B is brought up from zero volts to a high level, so that the ferroelectric capacitor 413 is driven into a polarization state. Assuming the polarization direction is from high voltage to low voltage, the polarization direction of the ferroelectric capacitor 413 is from "left" to "right". Next, at time T, the plate line 404 is brought up from zero volts to a high level and the common node A is at a low voltage, so that the ferroelectric capacitor 414 is driven into a polarization state. The polarization direction of the ferroelectric capacitor 414 is also from "left" to "right". The information in the volatile cell is stored in ferroelectric capacitors 413 and 414. The memory circuit 400 can be powered down without loss of information. Even though all voltages may drop to zero, the polarization states of capacitors 413 and 414 remain so that the information is preserved. It may be noted that while the user is free to continue normal operations of memory circuit 400, such normal operation can be reestablishing the previous data state in the memory circuit.

Figure 6:
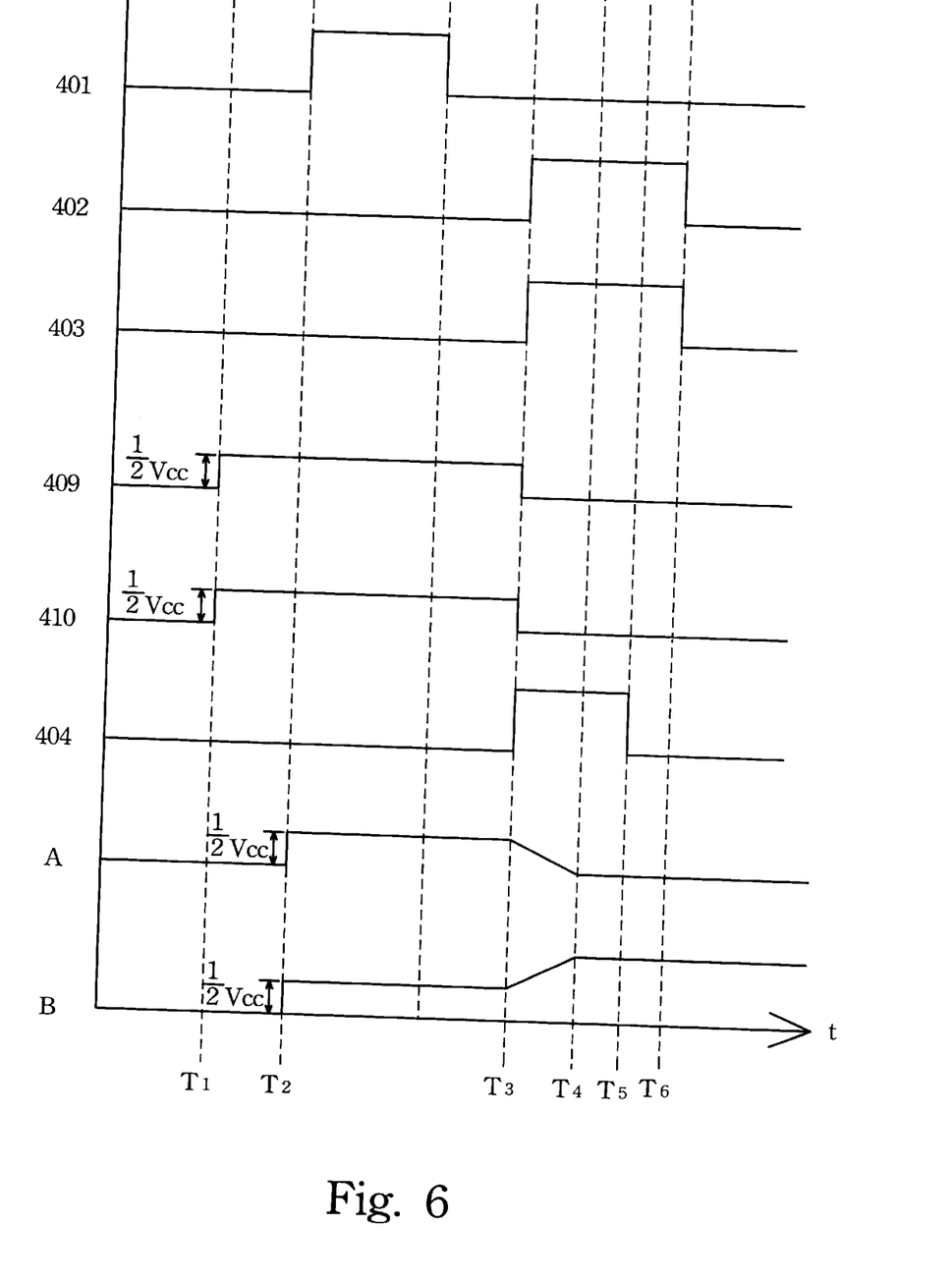
FIG. 6 illustrates a reestablishing waveform diagram of a nonvolatile memory circuit in accordance with the present invention.

FIG. 6 illustrates a reestablishing waveform diagram of a non-volatile memory circuit in accordance with the present invention. In accordance with the preferred embodiment, if memory circuit 400 has been powered down, the information stored in ferroelectric capacitors 413 and 414 can be restored to the volatile portion when power is restored. For the present example, it is assumed that the memory circuit 400 restoring data has been set to a logic "1" state, node A low and node B high. Thus, the polarization directions of the ferroelectric capacitors 413 and 414 are both from "left" to "right". The polarization states of the two ferroelectric capacitors, both relative to node C, are different. At time T1, the bit lines 409 and 410 will be precharge Voltage to 1/2 Vcc.

At time T2, a high voltage is applied to the word line 401 to turn on the MOS transistors 411 and 412, so that the voltage applied to bit line 409 and 410 raises the common nodes A and B in voltage.

At time T3, the voltages applied to word line 401 and bit lines 409, 410 are removed. A high voltage is applied to signal line 402 and 403 to turn on the MOS transistors 415 and 416, so that the ferroelectric capacitors 413 and 414 connect to the plate line 404. At this time, a high voltage, Vcc, is applied to the plate line 404 as indicated by the rising waveform for Vcc in FIG. 6. However, because the common node B voltage is at 1/2 Vcc, a voltage difference larger than the coercive voltage at node B and plate line 404 results in the ferroelectric capacitor to change the polarization direction. The polarization direction of "left" to "right" becomes "right" to "left" under the assumption of the polarization direction from high level to low level. On the other hand, since the common node A voltage is also at 1/2 Vcc, the ferroelectric capacitor polarization direction is from "left" to "right", which is the same as before.

From the foregoing description, at the termination of the voltage pulse at plate line 404, a net charge remains at node B because the positive pulse at plate line 404 is opposite to the polarization state of ferroelectric capacitor 413, thereby causing the ferroelectric capacitor 413 to transition the full state of the hysteresis curve. This is in contrast to the ferroelectric capacitor 414 which makes only a minor move along the hysteresis curve. The ferroelectric capacitor 413 changes polarization state; it therefore delivers more current to node B. However, the ferroelectric capacitor 414 does not change polarization state which makes only a minor current to node A and subsequently causes the voltage difference between node A and node B. The cross-coupled feedback of the transistors causes the node B to rapidly rise and the node A to be pulled to ground, thereby reestablishing the previous data state in the memory circuit 400.

After this state is reestablished, at time T5, the voltage Vcc applied to plate line 404 is removed, so that the polarization direction of ferroelectric capacitor 413 is changed again to restore the original polarization direction. At time T6, the voltage applied to the signal line 402 and 403 is removed and the reestablish operation is finished.

As understood by a person skilled in the art, the foregoing preferred embodiments of the present invention are illustrative rather than limiting of the present invention. The present invention is intended to cover various modifications and similar arrangements, such as depletion MOS transistor or resistor to replace the P-channel MOS transistor, which are included within the spirit and scope of the appended claims, the scope of which should be accorded the broadest interpretation so as to encompass all such modifications and similar structures.

What is claimed is:

1. A non-volatile ferroelectric capacitor memory circuit comprising:

a volatile memory cell portion having a flip-flop configuration and having two internal nodes latched into complementary states during operation of said volatile portion;

first and second ferroelectric capacitors each having respectively first and second plates, wherein said first plate of said first and second ferroelectric capacitors coupled to said two internal nodes respectively;

a first transistor providing a source-drain path for said second plate of said first ferroelectric capacitor to couple with said second plate of said second ferroelectric capacitor;

a second transistor having a source/drain electrode to couple with said source/drain electrode of said first transistor;

a plate line coupling said second transistor, and through said source-drain path of said second transistor coupling with said source/drain electrode of said first transistor; and first and second signal lines coupling with said first and second transistors, respectively.

2. The memory circuit of claim 1, further including:

a word line;

first and second access transistors each having a respective gate electrode coupling with said word line;

a first bit line coupling with one of said internal nodes via the source-drain path of said first access transistor; and a second bit line coupling with a second one of said internal nodes via the source-drain path of said second access transistor, whereby said memory circuit is selected when said word line turns on said first and second access transistors thereby coupling the bit lines to said internal nodes.

3. The memory circuit of claim 1, wherein in said complementary states one of said internal nodes is high and another of said internal nodes is low.

4. The memory circuit of claim 1, wherein said first and second signal line receive a voltage to turn on said first and second transistor during writing and restoring cycle thereby to couple said plate line to said second plate of said first and second ferroelectric capacitors, respectively, wherein said plate line receives a voltage to polarize said first and second ferroelectric capacitors.

5. The memory circuit of claim 4, wherein said restoring cycle reestablishes data stored in said first and second ferroelectric capacitors in said volatile memory cell portion when a power source is reconnected to said memory circuit.

6. The memory circuit of claim 4, wherein polarizing said two ferroelectric capacitors during a writing cycle further comprises application of the first voltage to said plate line to polarize one of said first and second ferroelectric capacitors and subsequent application of the second voltage to said plate line to polarize second one of said first and second ferroelectric capacitors.

7. The memory circuit of claim 6, wherein said first voltage is a high voltage and said second voltage is a low voltage.

8. The memory circuit of claim 6, wherein said first voltage is a low voltage and said second voltage is a high voltage.

9. The memory circuit of claim 4, wherein polarizing said two ferroelectric capacitors during said restoring cycle further comprises precharging said internal nodes of said volatile memory cell portion to a predetermined voltage and subsequently applying a high voltage to said plate line to polarize said first and second ferroelectric capacitors.

10. The memory circuit of claim 9, wherein said predetermined voltage is half of the high voltage.

11. A non-volatile ferroelectric capacitor memory circuit comprising:

a word line;

first and second access transistors having respective gate electrodes thereof coupling with said word line;

a volatile memory cell portion having a flip-flop configuration and having two internal nodes latched into complementary states during operation of said volatile portion and connected to said first and second access transistors, respectively;

a first bit line coupling with one of said internal nodes via a source-drain path of said first access transistor;

a second bit line coupling with a second one of said internal nodes via a source-drain path of said second access transistor, whereby said memory circuit is selected when said word line turns on said first and second access transistors thereby to couple the bit lines to said internal nodes;

first and second ferroelectric capacitors having respective the first and second plates, wherein said first plate of said first and second ferroelectric capacitors are coupled to said two internal nodes, respectively;

a first transistor providing a source-drain path for said second plate of said first ferroelectric capacitor to couple with said second plate of said second ferroelectric capacitor;

a second transistor having source/drain electrode to couple with said source/drain electrode of said first transistor;

a plate line coupling said second transistor, and through said source-drain path of said second transistor, coupling with said source/drain electrode of said first transistor; and first and second signal line coupling with said first and second transistors respectively.

12. The memory circuit of claim 11, wherein in said complementary states one of said internal nodes is high and another of said internal nodes is low.

13. The memory circuit of claim 11, wherein said first and second signal lines receives a voltage to turn on said first and second transistor during writing and restoring cycle thereby to couple said plate line to said second plate of said first and second ferroelectric capacitors, respectively, and said plate line receives a voltage to polarize said first and second ferroelectric capacitors.

14. The memory circuit of claim 13, wherein said restoring cycle reestablishes data stored in said first and second ferroelectric capacitors in said volatile memory cell portion when a power source is connected to said memory circuit again.

15. The memory circuit of claim 13, wherein polarizing said two ferroelectric capacitors during a writing cycle further comprises applying the first voltage to said plate line to polarize one of said first and second ferroelectric capacitors and subsequently applying the second voltage to said plate line to polarize a second one of said first and second ferroelectric capacitors.

16. The memory circuit of claim 15, wherein said first voltage is a high voltage and said second voltage is a low voltage.

17. The memory circuit of claim 15, wherein said first voltage is a low voltage and said second voltage is a high voltage.

18. The memory circuit of claim 13, wherein polarizing said two ferroelectric capacitors during said restoring cycle further comprises precharging said internal nodes of said volatile memory cell portion to a predetermined voltage and subsequently applying a high voltage to said plate line to polarize said first and second ferroelectric capacitors.

19. The memory circuit of claim 18, wherein said predetermined voltage is half of the high voltage.

* * * * *